(12) United States Patent
Ye

(10) Patent No.: US 9,843,333 B2
(45) Date of Patent: Dec. 12, 2017

(54) REFERENCE-FREQUENCY-INSENSITIVE PHASE LOCKED LOOP

(71) Applicant: MaxLinear, Inc., Carlsbad, CA (US)

(72) Inventor: Sheng Ye, Carlsbad, CA (US)

(73) Assignee: Maxlinear, Inc., Carlsbad, CA (US)

( * ) Notice: Subject to any disclaimer, the term of this patent is extended or adjusted under 35 U.S.C. 154(b) by 0 days.

(21) Appl. No.: 15/363,762

(22) Filed: Nov. 29, 2016

(65) Prior Publication Data

US 2017/0077934 A1 Mar. 16, 2017

Related U.S. Application Data

(63) Continuation of application No. 14/860,262, filed on Sep. 21, 2015, now Pat. No. 9,537,494, which is a continuation of application No. 14/452,204, filed on Aug. 5, 2014, now Pat. No. 9,166,606.

(60) Provisional application No. 61/867,333, filed on Aug. 19, 2013.

(51) Int. Cl.
| | |
|---|---|
| H03L 7/08 | (2006.01) |
| H03L 7/18 | (2006.01) |
| H03L 7/093 | (2006.01) |
| H03L 7/085 | (2006.01) |
| H03L 7/089 | (2006.01) |

(52) U.S. Cl.
CPC .............. *H03L 7/093* (2013.01); *H03L 7/08* (2013.01); *H03L 7/085* (2013.01); *H03L 7/0891* (2013.01); *H03L 7/18* (2013.01); *H03L 2207/10* (2013.01)

(58) Field of Classification Search
CPC ... H03L 7/0807; H03L 7/085; H03L 2207/10; G06F 1/04; G06F 1/10
USPC .......................................... 327/147, 155–159
See application file for complete search history.

(56) References Cited

U.S. PATENT DOCUMENTS

| | | |
|---|---|---|
| 5,703,540 A | 12/1997 | Gazda et al. |
| 7,295,824 B2 | 11/2007 | Kluge et al. |
| 7,525,392 B2 | 4/2009 | Tarng |
| 8,917,147 B2 | 12/2014 | Vasishtha et al. |
| 2017/0047932 A1* | 2/2017 | Gopalakrishnan ...... H03L 7/085 |

* cited by examiner

*Primary Examiner* — An Luu
(74) *Attorney, Agent, or Firm* — McAndrews, Held & Malloy

(57) ABSTRACT

A phase locked loop may be operable to generate, utilizing a frequency doubler, a reference clock signal whose frequency is twice a frequency of a crystal clock signal and is keyed on both rising and falling edges of the crystal clock signal. A sampled loop filter (SLPF) in the phase locked loop may capture charge from a charge pump (CHP) in the phase locked loop and the charge is captured at a frequency corresponding to the frequency of the reference clock signal. Opening a switch of the SLPF may hold the captured charge during a phase comparison and closing the switch may release the captured charge. The switch is controlled utilizing a control signal. By utilizing the SLPF in the phase locked loop, the phase locked loop may eliminate, at an output of the CHP, disturbance which is associated with duty cycle errors of the crystal clock signal.

20 Claims, 6 Drawing Sheets

REFERENCE-FREQUENCY-INSENSITIVE PHASE LOCKED LOOP

CROSS-REFERENCE TO RELATED APPLICATIONS/INCORPORATION BY REFERENCE

This application is a continuation of U.S. application Ser. No. 14/860,262 filed Sep. 21, 2015, which is a Continuation of U.S. application Ser. No. 14/452,204 filed Aug. 5, 2014, which in turn makes reference to, claims priority to and claims the benefit of U.S. Provisional Patent Application Ser. No. 61/867,333 filed on Aug. 19, 2013.

Each of the above stated applications is hereby incorporated herein by reference in its entirety.

FIELD OF THE DISCLOSURE

Certain embodiments of the disclosure relate to communications and/or signal processing. More specifically, certain embodiments of the disclosure relate to a method and system for a reference-frequency-insensitive phase locked loop.

BACKGROUND OF THE DISCLOSURE

Existing methods and systems for conventional phase locked loops (PLLs) can be costly, cumbersome and inefficient, and conventional phase locked loops (PLLs) may be sensitive to duty cycle errors associated with a reference clock. Further limitations and disadvantages of conventional and traditional approaches will become apparent to one of skill in the art, through comparison of such systems with the present disclosure as set forth in the remainder of the present application with reference to the drawings.

BRIEF SUMMARY OF THE DISCLOSURE

A system and/or method for a reference-frequency-insensitive phase locked loop, substantially as shown in and/or described in connection with at least one of the figures, as set forth more completely in the claims.

Various advantages, aspects and novel features of the present disclosure, as well as details of an illustrated embodiment thereof, will be more fully understood from the following description and drawings.

DETAILED DESCRIPTION OF THE DISCLOSURE

Figure 1:
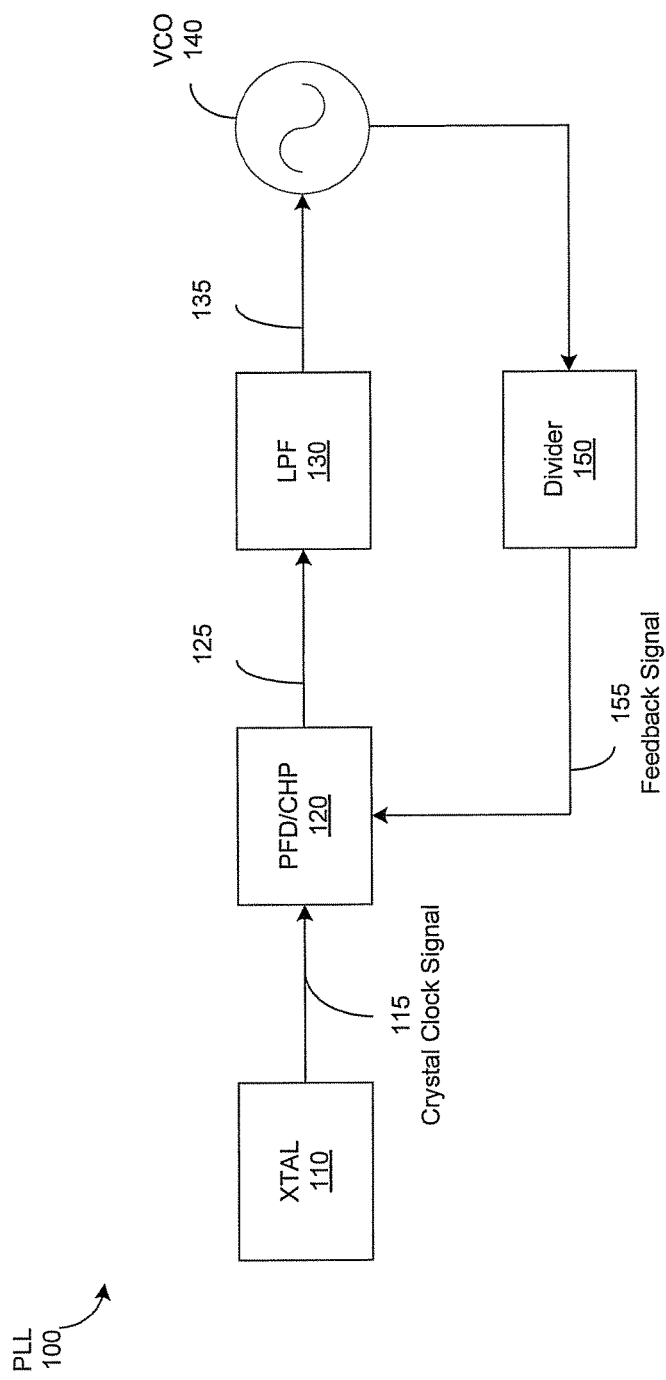
FIG. 1 is a block diagram illustrating an example conventional phase locked loop (PLL), in connection with an example embodiment of the disclosure.

As utilized herein the terms "circuit" and "circuitry" refer to physical electronic components (i.e. hardware) and any software and/or firmware ("code") which may configure the hardware, be executed by the hardware, and/or otherwise be associated with the hardware. As utilized herein, "and/or" means any one or more of the items in the list joined by "and/or". As an example, "x and/or y" means any element of the three-element set $\{(x), (y), (x, y)\}$. As another example, "x, y, and/or z" means any element of the seven-element set $\{(x), (y), (z), (x, y), (x, z), (y, z), (x, y, z)\}$. As utilized herein, the term "exemplary" means serving as a non-limiting example, instance, or illustration. As utilized herein, the terms "e.g.," and "for example" set off lists of one or more non-limiting examples, instances, or illustrations. As utilized herein, a device/module/circuitry/etc. is "operable" to perform a function whenever the device/module/circuitry/etc. comprises the necessary hardware and code (if any is necessary) to perform the function, regardless of whether performance of the function is disabled, or not enabled, by some user-configurable setting.

Certain embodiments of the disclosure can be found in a method and system for a reference-frequency-insensitive phase locked loop. In various embodiments of the disclosure, a phase locked loop may be operable to enable usage of both rising and falling edges of a crystal clock signal generated by a crystal in the phase locked loop for an operation of the phase locked loop, and perform the operation of the phase locked loop based on the enabling.

In an example embodiment of the disclosure, the phase locked loop may be operable to generate a reference clock signal whose frequency is twice (or some other multiple of) a frequency of the crystal clock signal and is keyed on both rising and falling edges of the crystal clock signal. The phase locked loop may be operable to enable the usage of both rising and falling edges of the crystal clock signal based on the generated reference clock signal. In this regard, the phase locked loop may be operable to generate the reference clock signal utilizing, for example, a frequency doubler in the phase looked loop.

In an example embodiment of the disclosure, the phase locked loop may be operable to perform a phase comparison function, based on both rising and falling edges of the crystal clock signal, in or during the operation of the phase locked loop. In this regard, the phase locked loop may be operable to utilize a sampled loop filter (SLPF) in the phase locked loop during the performing of the phase comparison function. The sampled loop filter (SLPF) may be operable to capture charge, for example, at a frequency corresponding to the frequency of the reference clock signal, from a charge pump (CHP) in the phase locked loop. The sampled loop filter (SLPF) may be operable to then release the captured charge, for example, after each two consecutive highs of the reference clock signal and corresponding to falling edges of the crystal clock signal.

In an example embodiment of the disclosure, the crystal clock signal may comprise duty cycle errors. The duty cycle errors may result in disturbance at an output of the charge pump (CHP), in or during the operation of the phase locked loop. In such instances, the phase locked loop may be operable to eliminate the disturbance associated with the duty cycle errors, utilizing the above mentioned sampled loop filter (SLPF), in or during the operation of the phase locked loop.

FIG. 1 is a block diagram illustrating an example conventional phase locked loop (PLL) in connection with an example embodiment of the disclosure. Referring to FIG. 1, there is shown a phase locked loop (PLL) 100. The PLL 100 may comprise suitable logic, circuitry, interfaces and/or code for generating an output signal whose phase may be related to the phase of an input signal.

In its most basic implementation, a conventional phase locked loop may comprise, for example, a variable frequency oscillator component and a phase detector, with the frequency oscillator component generating a periodic signal and the phase detector comparing the phase of that generated signal with the phase of an input signal of the phase detector—e.g., to adjust the oscillator component generating, based on the comparison, to keep the phases matched. Bringing an output signal back toward the input signal for comparison is called a feedback loop since the output is "fed back" toward the input signal forming a loop. Accordingly, PLLs may function based on bringing the output signal back (i.e., 'feeding back') toward the input signal for comparison, thus forming a loop. Keeping the input and output phase in lock may also allow keeping the input and output frequencies the same. Consequently, in addition to synchronizing signals, a phase locked loop may be used to track an input frequency, or it can generate a frequency that is a multiple of the input frequency. Accordingly, PLLs may be utilized as control systems or components, providing signals for use in such operation as clock synchronization, demodulation, frequency synthesis, and the like. For example, PLLs may be utilized in radio, television, communications, computers and other electronic applications. In this regard, the PLLs may be utilized in these systems to demodulate signals, recover signals (e.g., from noisy communication channels), generate a stable frequency at multiples of an input frequency (e.g., for frequency synthesis), and/or distribute precisely timed clock pulses (e.g., in digital circuits such as microprocessors).

In the example implementation shown in FIG. 1, the PLL 100 may comprise a crystal (XTAL) 110, a phase frequency detector/charge pump (PFD/CHP) block 120, a loop filter (LPF) 130, a voltage controlled oscillator (VCO) 140, and a divider 150. In this regard, the XTAL 110 may comprise suitable logic, circuitry, interfaces and/or code that may be operable to generate a periodic crystal clock signal 115 (e.g., based on oscillation in crystal 110).

The PFD (of the PFD/CHP block 120) may comprise suitable logic, circuitry, interfaces and/or code that may be operable to detect the difference in phase and/or frequency between the crystal clock signal 115 (a reference signal) and a feedback signal 155, and generate a corresponding error signal which is proportional to the phase difference (e.g., an error signal for adjusting the frequency at which the VCO 140 is operating—i.e., at a higher or lower frequency).

The CHP (of PFD/CHP block 120) may comprise suitable logic, circuitry, interfaces and/or code that may be operable to apply adjustments 125 specified by the PFD's error signal—e.g., driving current into LPF 130 to 'up' (i.e., increase) the frequency, or draw current from the LPF 130 to 'down' (i.e., lower) the frequency.

The LPF 130 may comprise suitable logic, circuitry, interface and/or code that may be operable to then apply the changes to the VCO 140, such as by converting the charges (currents) adjustments 125 applied by the CHP into a control voltage 135 that is used to bias the VCO 140.

The VCO 140 may comprise suitable logic, circuitry, interfaces and/or code that may be operable to function as an electronic oscillator whose oscillation frequency is controlled by a voltage input (e.g., the control voltage 135). An output of VCO 140 (in addition to actual intended uses therefore) may be looped back, for use in controlling phase (and frequency) of signals of the PLL 100. In this regard, the divider 150 may be inserted in the feedback loop to produce a frequency synthesizer, such as to allow the VCO 140 frequency above the frequency of the crystal clock signal 115.

In various implementations of the present disclosure, performance of conventional PLLs may be enhanced, in an optimized manner. This may be achieved by, for example, incorporating additional features/functions, and/or modifying typically utilized ones, to improve performance of the PLL in an efficient manner. For example, in some implementations the frequency of the crystal signal (i.e., signal outputted by the XTAL 110) may be increased (e.g., doubled) without reducing the frequency resolution. Furthermore, rather than utilizing a legacy or typical LPF, a sampled loop filter (SLPF) may be utilized, which may enhance performance of the PLL because, for example, it may be insensitive to duty cycle errors. Accordingly, incorporation of such features may result in improved overall phase noise (PN) associated with a low-frequency crystal (XTAL). A phase noise (PN) may be described, for example, as a frequency domain representation of rapid, short-term, random fluctuations in a phase of a waveform, caused by time domain instabilities (e.g., "jitter").

Figure 2:
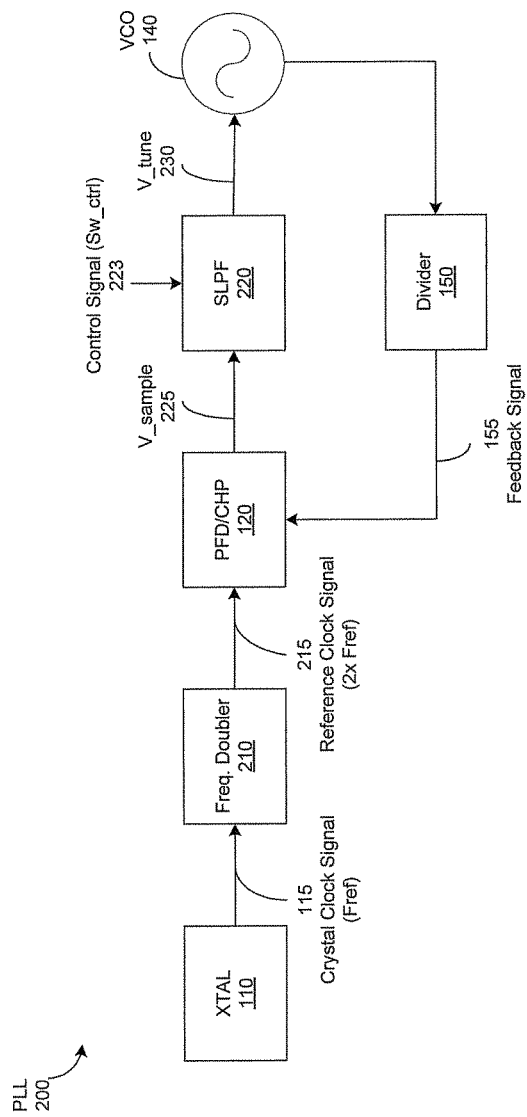
FIG. 2 is a block diagram illustrating an example reference-frequency-insensitive phase locked loop (PLL), in accordance with an example embodiment of the disclosure.

FIG. 2 is a block diagram illustrating an example reference-frequency-insensitive phase locked loop (PLL), in accordance with an example embodiment of the disclosure. Referring to FIG. 2, there is shown a PLL 200.

The PLL 200 may be substantially similar to the PLL 100 of FIG. 1, for example, and may comprise the crystal (XTAL) 110, the PFD/CHP block 120, the voltage controlled oscillator (VCO) 140, and the divider 150. However, to enhance performance of the PLL 200 compared to the PLL 100 (representing conventional PLL implementation), additional components may be added and/or particular components may be modified. For example, a frequency doubler block 210 may be inserted between the XTAL 110 and the PFD/CHP 120. Also, the LPF 130 may be replaced with a sampled loop filter (SLPF) 220.

The frequency doubler 210 may comprise suitable logic, circuitry, interfaces and/or code that may be operable to double the frequency of the signals (e.g., the crystal clock signal 115) outputted by the XTAL 110, and accordingly, generates a reference clock signal 215. Doing so may enable use of both rising and falling edges of the XTAL 110 clock signal 115 used for phase comparison (e.g., performed by the PFD of the PFD/CHP block 120).

The SLPF 220 may comprise suitable logic, circuitry, interfaces and/or code that may be operable to capture charges from the charge pump (CHP) function (of the PFD/CHP 120) at a frequency twice the frequency of the crystal clock signal 115 (2× Fref). However, the charge is only released at the frequency of the crystal clock signal 115 (1× Fref).

The phase frequency detector (PFD) function (of the PFD/CHP 120) would remain unchanged. Accordingly, with the effective double Fref (2× Fref), duty cycle error (e.g., none 50% duty cycle) may be absorbed in the filter capacitors of the SLPF 110, as further described below.

While the implementation described herein is based on doubling the XTAL clock, it should be understood that other variations (e.g., M-times the XTAL clock, where M may be an integer) may be implemented in a substantially similar manner.

Figure 3:
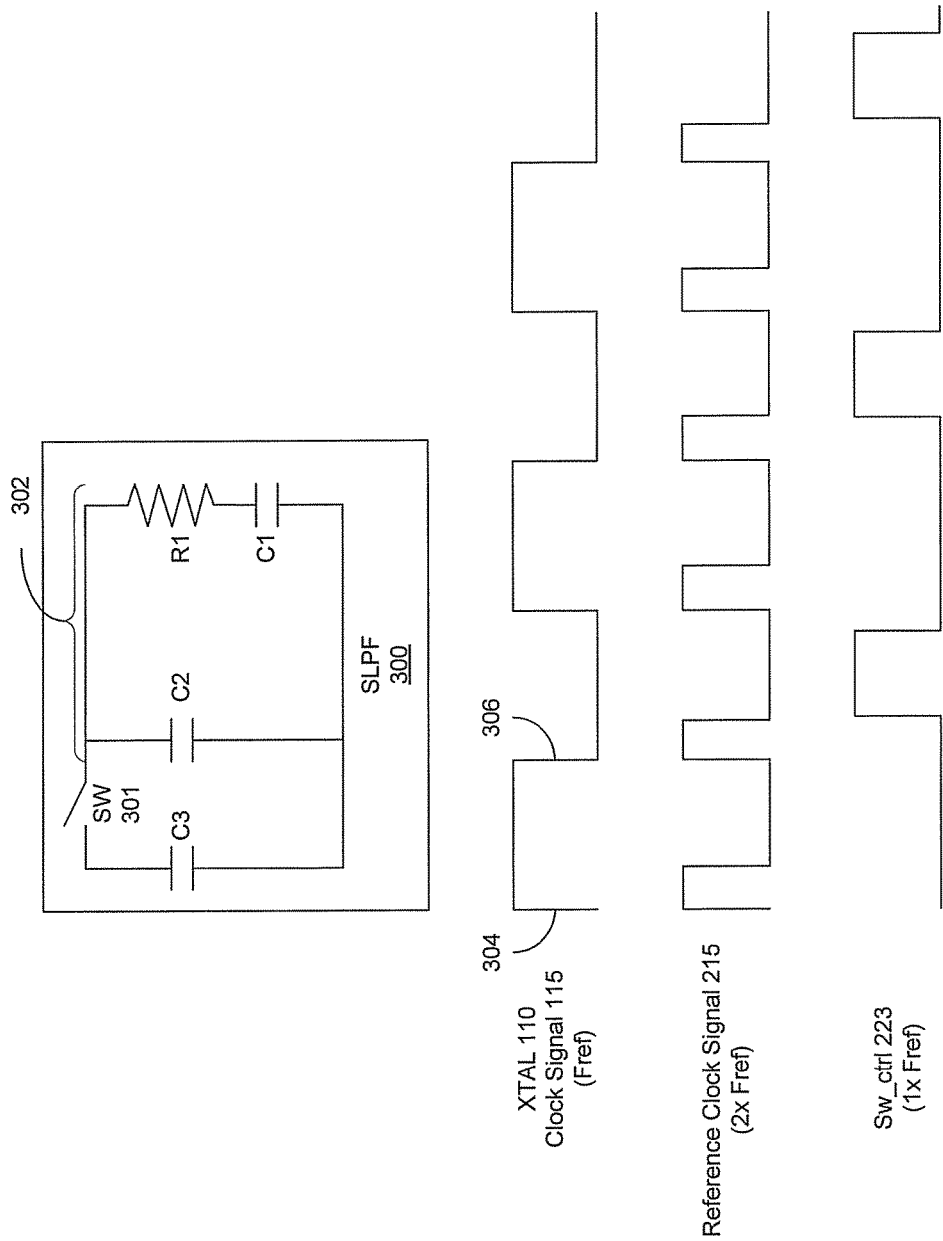
FIG. 3 is a diagram illustrating an example sampled loop filter (SLPF) for use in a reference-frequency-insensitive phase locked loop (PLL), in accordance with an example embodiment of the disclosure.

FIG. 3 is a diagram illustrating an example sampled loop filter (SLPF) for use in a reference-frequency-insensitive phase locked loop (PLL), in accordance with an example embodiment of the disclosure. Referring to FIG. 3, there is shown an example sampled loop filter (SLPF) 300. The SLPF 300 may be substantially similar to or the same as the SLPF 220 described with respect to FIG. 2, for example.

In the example implementation shown in FIG. 3, the SLPF 300 may comprise, for example, three capacitors (C1, C2, and C3) and a single resistor R1, with a switch (SW 301). In this regard, the switch (SW 301) may be used in managing holding/dumping of charges used in phase comparisons—e.g., opening the switch (SW 301) holds the charges in C3 during the phase comparisons, while closing the switch (SW 301) dumps (releases) the charges to R1, C1, and C2 (a main loop filter 302). The SLPF 300 may be configured to capture charges from CHP (of the PFD/CHP block 120) at 2× Fref, as result of the doubling of the crystal clock XTAL 110 (e.g., phase comparisons are done based on both rising and falling edges 304, 306 of XTAL 110 clock).

The timing flows of the XTAL 110 clock signal 115 and the reference clock signal 215 (whose frequency is twice the frequency of the XTAL 110 clock, and is keyed on both rising and falling edges 304, 306 of the XTAL 110 clock) may correspond to example use scenario. The switch (SW 301) of the SLPF 300 may be controlled using a control signal (Sw_ctrl) 223. In this regard, when the Sw_ctrl signal 223 is asserted, the switch (SW 301) is asserted, and the charge held in the phase comparison (in the PFD/CHP block 120) may be dumped or released. Accordingly, Sw_ctrl signal 223 may be configured, for example, to dump or release the charge after each two consecutive/adjacent highs of the signal 215—e.g., may be set up based on the completion of the signal 215 corresponding to the falling edges 306 of the XTAL 110 clock signal 115, as shown in FIG. 3.

In operation, the phase locked loop (PLL) 200 may be operable to enable usage of both rising and falling edges 304, 306 of the crystal clock signal 115, which may be generated by the crystal (XTAL) 110 for the operation of the phase locked loop (PLL) 200. The phase locked loop (PLL) 200 may then be operable to perform the operation(s) based on the above mentioned enabling.

In an example embodiment of the disclosure, the phase locked loop (PLL) 200 may be operable to generate a reference clock signal 215 whose frequency is twice (or some other multiple of) the frequency of the crystal clock signal 115 and is keyed on both rising and falling edges 304, 306 of the crystal clock signal 115. The phase locked loop (PLL) 200 may then be operable to enable the usage of both rising and falling edges 304, 306 of the crystal clock signal 115 based on the generated reference clock signal 215. In this regard, the phase locked loop (PLL) 200 may be operable to generate the reference clock signal 215 utilizing, for example, the frequency doubler 210 in the phase looked loop (PLL) 200.

During the operation of the phase locked loop (PLL) 200, the phase locked loop (PLL) 200 may perform a phase comparison function, based on both rising and falling edges 304, 306 of the crystal clock signal 115. In this regard, the phase locked loop (PLL) 200 may be operable to utilize (in addition to utilizing a phase frequency detector/charge pump (PFD/CHP) 120) a sampled loop filter (SLPF) 220 in the phase locked loop (PLL) 200 during the performing of the phase comparison function. In such instances, the sampled loop filter (SLPF) 220 may be operable to capture charge, for example, at a frequency corresponding to the frequency of the reference clock signal 215, from the charge pump (CHP) 120 in the phase locked loop (PLL) 200. The sampled loop filter (SLPF) 220 may then be operable to release the captured charge, for example, after each two consecutive highs of the reference clock signal 215 and corresponding to falling edges 306 of the crystal clock signal 115.

Figure 4:
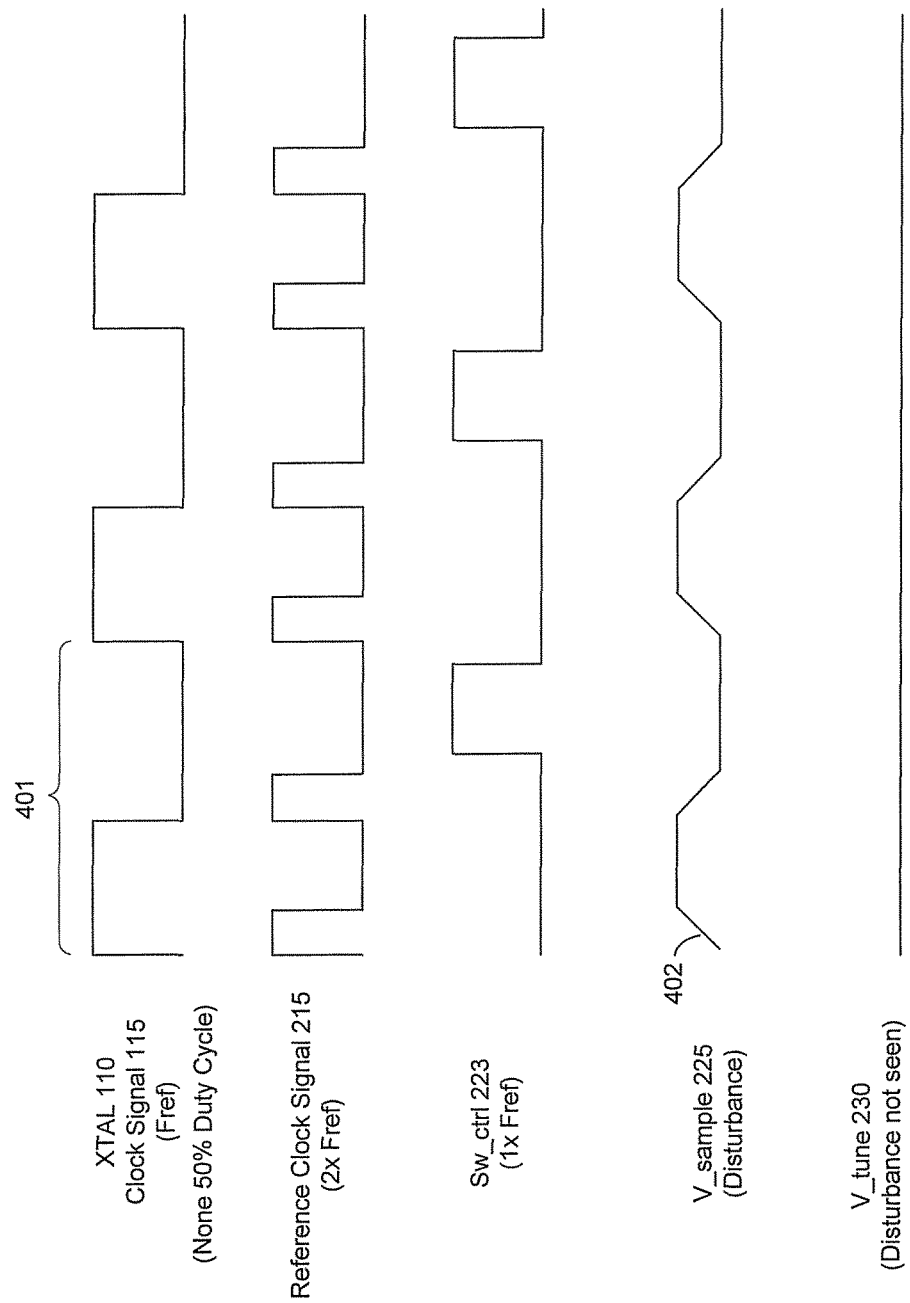
FIG. 4 illustrates timing flows for an example sampled loop filter (SLPF) in a reference-frequency-insensitive phase locked loop (PLL), in accordance with an example embodiment of the disclosure.

FIG. 4 illustrates timing flows for an example sampled loop filter (SLPF) in a reference-frequency-insensitive phase locked loop (PLL), in accordance with an example embodiment of the disclosure.

The timing flows of FIG. 4 show example timing of the XTAL 110 clock signal 115 and corresponding reference clock signal 215 (2× Fref) resulting from incorporation of the frequency doubler 210 in the PLL 200 (along with the Sw_ctrl signal 223 used in controlling the switch (SW 301) in the example implementation of the SLPF 300 shown in FIG. 3). As shown in FIG. 4, duty cycle errors 401 (e.g., none 50% duty cycle) may result in a periodic disturbance 402 in locked condition (e.g., as shown in timing flow of V_sample 225, which corresponds to the output of the PFD/CHP 120 and to the input to the SLPF 220). If this disturbance 402 is not eliminated, it may result in turn in significant reference spurs at an output of the PLL 200. These reference spurs may be considered as unwanted sideband signals. With the sampling performed by a SLPF (e.g., the SLPF 300), the disturbance 402 may not be seen at the output side of the SLPF (e.g., as shown in timing flow of V_tune 230, which corresponds to the output of the SLPF 220).

In operation, the crystal clock signal 115 may comprise, for example, duty cycle errors 401 (e.g., none 50% duty cycle). The duty cycle errors 401 may result in disturbance 402 at the output of the charge pump (CHP) 120, during the operation of the phase locked loop (PLL) 200. In such instances, the phase locked loop (PLL) 200 may eliminate the disturbance 402 associated with the duty cycle errors 401, utilizing the above mentioned sampled loop filter (SLPF) 220, during the operation of the phase locked loop (PLL) 200.

Figure 5:
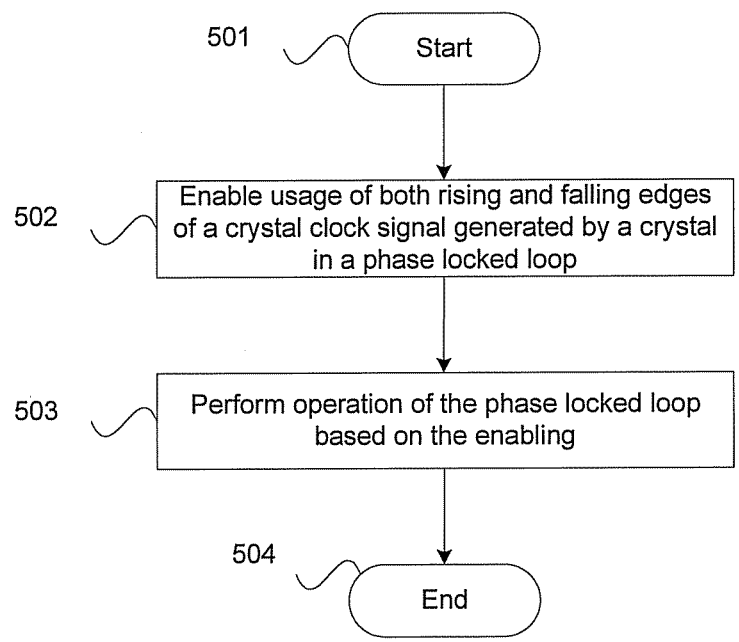
FIG. 5 is a flow chart illustrating example steps for a reference-frequency-insensitive phase locked loop, in accordance with an example embodiment of the disclosure.

FIG. 5 is a flow chart illustrating example steps for a reference-frequency-insensitive phase locked loop, in accordance with an example embodiment of the disclosure. Referring to FIG. 5, the example steps start at step 501. In step 502, the phase locked loop (PLL) 200 may be operable to enable usage of both rising and falling edges 304, 306 of the crystal clock signal 115 generated by the crystal (XTAL) 110 in the phase locked loop (PLL) 200 for an operation of the phase locked loop (PLL) 200. In step 503, the phase locked loop (PLL) 200 may be operable to perform the operation of the phase locked loop (PLL) 200 based on the enabling of using both rising and falling edges 304, 306 of the crystal clock signal 115 for the operation. The example steps may proceed to the end step 504.

Figure 6:
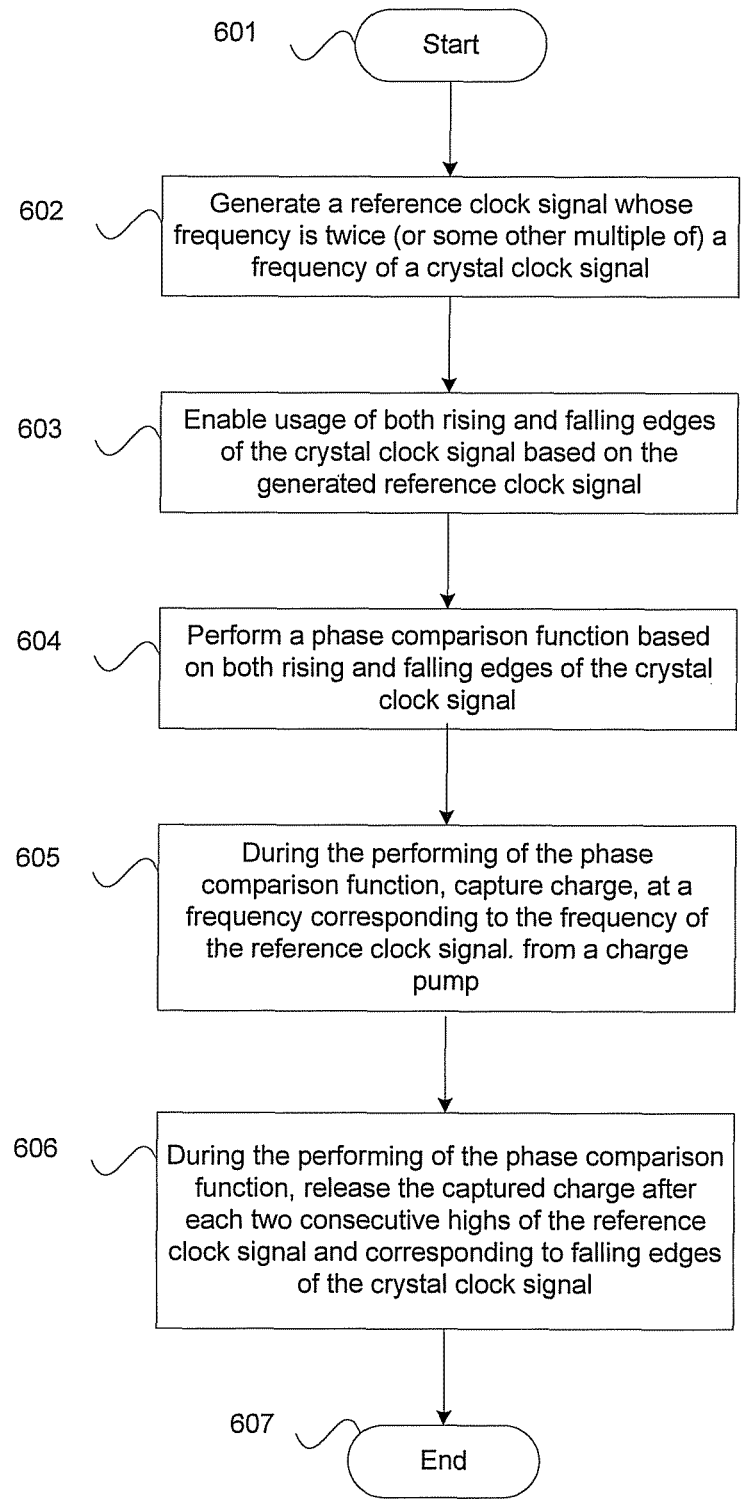
FIG. 6 is a flow chart illustrating example steps for implementing a reference-frequency-insensitive phase locked loop, in accordance with an example embodiment of the disclosure.

FIG. 6 is a flow chart illustrating example steps for implementing a reference-frequency-insensitive phase locked loop, in accordance with an example embodiment of the disclosure. Referring to FIG. 6, the example steps start at step 601. In step 602, the phase locked loop (PLL) 200 may be operable to generate a reference clock signal 215 whose frequency is twice (or some other multiple of) a frequency of the crystal clock signal 115 and may be keyed on both rising and falling edges 304, 306 of the crystal clock signal 115. In this regard, the reference clock signal 215 may be generated utilizing the frequency doubler 210 in the phase locked loop (PLL) 200. In step 603, the phase locked loop (PLL) 200 may be operable to enable the usage of both rising and falling edges 304, 306 of the crystal clock signal 115 based on the generated reference clock signal 215. In step 604, the phase locked loop (PLL) 200 may be operable to perform a phase comparison function based on both rising and falling edges 304, 306 of the crystal clock signal 115, in or during the operation of the phase locked loop (PLL) 200. In this regard, the sampled loop filter (SLPF) 220 may be utilized in the phase locked loop (PLL) 200 during the performing of the phase comparison function.

In step 605, during the performing of the phase comparison function, the sampled loop filter (SLPF) 220 may be operable to capture charge, at a frequency corresponding to the frequency of the reference clock signal 215, from the charge pump (CHP) 120 in the phase locked loop (PLL) 200. In step 606, during the performing of the phase comparison function, the sampled loop filter (SLPF) 220 may be operable to release the captured charge after each two consecutive highs of the reference clock signal 215 and corresponding to falling edges 306 of the crystal clock signal 115. The example steps may proceed to the end step 607.

In various embodiments of the disclosure, a phase locked loop such as the phase locked loop (PLL) 200 may be operable to enable usage of both rising and falling edges 304, 306 of a crystal clock signal, such as the crystal clock signal 115, which may be generated by a crystal, such as the crystal (XTAL) 110, in the phase locked loop (PLL) 200 for an example operation of the phase locked loop (PLL) 200. The phase locked loop (PLL) 200 may then be operable to perform the operation of the phase locked loop (PLL) 200 based on the enabling.

The phase locked loop (PLL) 200 may be operable to generate a reference clock signal 215 whose frequency is twice (or some other multiple of) a frequency of the crystal clock signal 115 and is keyed on both rising and falling edges 304, 306 of the crystal clock signal 115. The phase locked loop (PLL) 200 may then be operable to enable the usage of both rising and falling edges 304, 306 of the crystal clock signal 115 based on the generated reference clock signal 215. In this regard, the phase locked loop (PLL) 200 may be operable to generate the reference clock signal 215 utilizing, for example, a frequency doubler such as the frequency doubler 210 in the phase looked loop (PLL) 200.

The phase locked loop (PLL) 200 may be operable to perform a phase comparison function, based on both rising and falling edges 304, 306 of the crystal clock signal 115, in or during the operation of the phase locked loop (PLL) 200. In this regard, the phase locked loop (PLL) 200 may be operable to utilize (in addition to utilizing a phase frequency detector/charge pump (PFD/CHP) 120) a sampled loop filter (SLPF) 220 in the phase locked loop (PLL) 200 during the performing of the phase comparison function. The sampled loop filter (SLPF) 220 may be operable to capture charge, for example, at a frequency corresponding to the frequency of the reference clock signal 215, from a charge pump (CHP) 120 in the phase locked loop (PLL) 200. The sampled loop filter (SLPF) 220 may be operable to then release the captured charge, for example, after each two consecutive highs of the reference clock signal and corresponding to falling edges 306 of the crystal clock signal 115.

In some instances, the crystal clock signal 115 may comprise, for example, duty cycle errors 401. The duty cycle errors 401 may result in disturbance 402 at an output of the charge pump (CHP) 120, in or during the operation of the phase locked loop (PLL) 200. In such instances, the phase locked loop (PLL) 200 may be operable to eliminate the disturbance 402 associated with the duty cycle errors 401, utilizing the above mentioned sampled loop filter (SLPF) 220, in or during the operation of the phase locked loop (PLL) 200.

Other embodiments of the disclosure may provide a non-transitory computer readable medium and/or storage medium, and/or a non-transitory machine readable medium and/or storage medium, having stored thereon, a machine code and/or a computer program having at least one code section executable by a machine and/or a computer, thereby causing the machine and/or computer to perform the steps as described herein for a reference-frequency-insensitive phase locked loop.

Accordingly, aspects of the present disclosure may be realized in hardware, software, or a combination of hardware and software. The present disclosure may be realized in a centralized fashion in at least one computer system or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

Aspects of the present disclosure may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present disclosure has been described with reference to certain embodiments, it will be understood by those skilled in the art that various changes may be made and equivalents may be substituted without departing from the scope of the present disclosure. In addition, many modifications may be made to adapt a particular situation or material to the teachings of the present disclosure without departing from its scope. Therefore, it is intended that the present disclosure not be limited to the particular embodiment disclosed, but that the present disclosure will include all embodiments falling within the scope of the appended claims.

What is claimed is:

1. A method, comprising:
   generating, by a phase locked loop, a reference clock signal whose frequency is twice a frequency of a crystal clock signal and is keyed on both rising and falling edges of the crystal clock signal, wherein the crystal clock signal is generated by a crystal in the phase locked loop; and
   capturing, by a sampled loop filter (SLPF) in the phase locked loop during an operation of the phase locked loop, charge from a charge pump (CHP) in the phase locked loop, wherein:
   the charge is captured at a frequency corresponding to the frequency of the reference clock signal;
   opening a switch of the sampled loop filter (SLPF) holds the captured charge during a phase comparison; and
   closing the switch releases the captured charge.

2. The method according to claim 1, comprising generating the reference clock signal utilizing a frequency doubler in the phase locked loop.

3. The method according to claim 1, wherein the sampled loop filter (SLPF) releases the captured charge after each two consecutive highs of the reference clock signal and corresponding to falling edges of the crystal clock signal.

4. The method according to claim 1, comprising controlling the switch utilizing a control signal.

5. The method according to claim 4, wherein when the control signal is asserted, the switch is asserted and the captured charge is released.

6. The method according to claim 1, comprising enabling the usage of both rising and falling edges of the crystal clock signal based on the generated reference clock signal.

7. The method according to claim 6, comprising performing a phase comparison function, based on both rising and falling edges of the crystal clock signal, in the operation of the phase locked loop.

8. The method according to claim 1, wherein the crystal clock signal comprises duty cycle errors.

9. The method according to claim 8, wherein the duty cycle errors from the crystal clock signal result in disturbance at an output of the charge pump (CHP), in the operation of the phase locked loop.

10. The method according to claim 9, comprising eliminating the disturbance associated with the duty cycle errors, utilizing the sampled loop filter (SLPF) in the operation of the phase locked loop.

11. A system, comprising:
a phase locked loop, the phase locked loop being operable to:
generate a reference clock signal whose frequency is twice a frequency of a crystal clock signal and is keyed on both rising and falling edges of the crystal clock signal, wherein the crystal clock signal is generated by a crystal in the phase locked loop; and
capture, by a sampled loop filter (SLPF) in the phase locked loop during an operation of the phase locked loop, charge from a charge pump (CHP) in the phase locked loop, wherein:
the charge is captured at a frequency corresponding to the frequency of the reference clock signal;
opening a switch of the sampled loop filter (SLPF) holds the captured charge during a phase comparison; and
closing the switch releases the captured charge.

12. The system according to claim 11, wherein the phase locked loop is operable to generate the reference clock signal utilizing a frequency doubler in the phase locked loop.

13. The system according to claim 11, wherein the sampled loop filter (SLPF) releases the captured charge after each two consecutive highs of the reference clock signal and corresponding to falling edges of the crystal clock signal.

14. The system according to claim 11, wherein the phase locked loop is operable to control the switch utilizing a control signal.

15. The system according to claim 14, wherein when the control signal is asserted, the switch is asserted and the captured charge is released.

16. The system according to claim 11, wherein the phase locked loop is operable to enable the usage of both rising and falling edges of the crystal clock signal based on the generated reference clock signal.

17. The system according to claim 16, wherein the phase locked loop is operable to perform a phase comparison function, based on both rising and falling edges of the crystal clock signal, in the operation of the phase locked loop.

18. The system according to claim 11, wherein the crystal clock signal comprises duty cycle errors.

19. The system according to claim 18, wherein the duty cycle errors from the crystal clock signal result in disturbance at an output of the charge pump (CHP), in the operation of the phase locked loop.

20. The system according to claim 19, wherein the phase locked loop is operable to eliminate the disturbance associated with the duty cycle errors, utilizing the sampled loop filter (SLPF) in the operation of the phase locked loop.

* * * * *